(12) United States Patent
Varanasi (10) Patent No.: US 9,405,622 B2
(45) Date of Patent: Aug. 2, 2016

(54) SHAPING CODES FOR MEMORY

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/643,199

(22) Filed: Mar. 10, 2015

(65) Prior Publication Data
US 2015/0178158 A1   Jun. 25, 2015

Related U.S. Application Data

(63) Continuation of application No. 13/683,440, filed on Nov. 21, 2012, now Pat. No. 8,984,369.

(51) Int. Cl.
| | |
|---|---|
| *G11C 29/00* | (2006.01) |
| *G06F 11/10* | (2006.01) |
| *G11C 11/56* | (2006.01) |
| *G11C 16/10* | (2006.01) |
| *G11C 7/10* | (2006.01) |
| *G11C 29/04* | (2006.01) |
| *G11C 29/50* | (2006.01) |

(52) U.S. Cl.
CPC ............ *G06F 11/1072* (2013.01); *G06F 11/10* (2013.01); *G06F 11/1012* (2013.01); *G06F 11/1016* (2013.01); *G11C 7/1006* (2013.01); *G11C 11/5628* (2013.01); *G11C 16/10* (2013.01); *G11C 29/04* (2013.01); *G11C 29/50016* (2013.01); *G11C 2029/5002* (2013.01)

(58) Field of Classification Search
CPC . G06F 11/1072; G06F 11/11; G06F 11/1016; G11C 11/5628; G11C 16/10; G11C 7/1006
See application file for complete search history.

(56) References Cited

U.S. PATENT DOCUMENTS

| | | | |
|---|---|---|---|
| 5,835,413 | A | 11/1998 | Hurter et al. |
| 6,794,997 | B2 | 9/2004 | Sprouse |

(Continued)

FOREIGN PATENT DOCUMENTS

| | | |
|---|---|---|
| WO | 2010/092536 A1 | 8/2010 |
| WO | 2012020278 | 2/2012 |
| WO | 2012023102 | 2/2012 |

OTHER PUBLICATIONS

Tanakamaru, et al., "Non-Violatile Memory Solutions," Feb. 22, 2011, 3 pages, IEEE International Solid State Circuits Conference, Tokyo, Japan.

(Continued)

*Primary Examiner* — Sam Rizk
(74) *Attorney, Agent, or Firm* — Brooks, Cameron & Huebsch, PLLC (57) ABSTRACT

Apparatuses and methods associated with shaping codes for memory are provided. One example apparatus comprises an array of memory cells and a shaping component coupled to the array and configured to encode each of a number of received digit patterns according to a mapping of received digit patterns to shaping digit patterns. The mapping of received digit patterns to shaping digit patterns obeys a shaping constraint that limits, to an uppermost amount, an amount of consecutive digits of the shaping digit patterns allowed to have a particular digit value.

17 Claims, 6 Drawing Sheets

(56) References Cited

U.S. PATENT DOCUMENTS

| | | |
|---|---|---|
| 7,573,969 B2 | 8/2009 | Shen et al. |
| 7,675,783 B2 | 3/2010 | Park et al. |
| 7,802,132 B2 | 9/2010 | Annavajjhala et al. |
| 7,848,152 B1 | 12/2010 | Huang et al. |
| 8,009,472 B2 | 8/2011 | Murin et al. |
| 8,239,735 B2 | 8/2012 | Shalvi et al. |
| 2008/0158948 A1* | 7/2008 | Sharon et al. ............ 365/185.02 |
| 2008/0278356 A1* | 11/2008 | Theis ................ G11B 20/1426 341/59 |
| 2010/0202198 A1 | 8/2010 | Kim et al. |
| 2010/0238730 A1 | 9/2010 | Dutta et al. |
| 2010/0269016 A1 | 10/2010 | Ware |
| 2011/0051507 A1 | 3/2011 | Sarkar et al. |
| 2011/0090734 A1* | 4/2011 | Burger et al. ............ 365/185.03 |
| 2011/0093652 A1 | 4/2011 | Sharon et al. |
| 2011/0252188 A1 | 10/2011 | Weingarten |
| 2011/0286271 A1 | 11/2011 | Chen |
| 2012/0054582 A1 | 3/2012 | Byom et al. |
| 2012/0147672 A1 | 6/2012 | Radke |
| 2012/0266043 A1 | 10/2012 | Nakura et al. |
| 2013/0238959 A1 | 9/2013 | Birk et al. |

OTHER PUBLICATIONS

U.S. Appl. No. 13/222,942, entitled Apparatuses and Methods of Operating for Memory Endurance, filed Aug. 31, 2011, 36 pages.
International Search Report and the Written Opinion of International Patent Application No. PCT/US2013/070303, dated Feb. 26, 2014, 11 pp.
Office Action from related Taiwan patent application No. 102141779, dated Jun. 15, 2015, 28 pp.
Office Action for related Taiwan Patent Application No. 102141779, dated Nov. 12, 2015, 16 pages.
Notice of Rejection for related Korea Patent Application No. 10-2015-7016144, dated Apr. 18, 2016, 7 pages.
Extended European Search Report for related EP Patent Application No. 13856826.6, dated Jun. 1, 2016, 6 pages.

\* cited by examiner

| RECEIVED BIT PATTERN | SHAPING BIT PATTERN |
|---|---|
| 0 0 0 0 | 1 1 0 0 1 |
| 0 0 0 1 | 1 1 0 1 1 |
| 0 0 1 0 | 1 0 0 1 0 |
| 0 0 1 1 | 1 0 0 1 1 |
| 0 1 0 0 | 1 1 1 0 1 |
| 0 1 0 1 | 1 0 1 0 1 |
| 0 1 1 0 | 1 0 1 1 0 |
| 0 1 1 1 | 1 0 1 1 1 |
| 1 0 0 0 | 1 1 0 1 0 |
| 1 0 0 1 | 0 1 0 0 1 |
| 1 0 1 0 | 0 1 0 1 0 |
| 1 0 1 1 | 0 1 0 1 1 |
| 1 1 0 0 | 1 1 1 1 0 |
| 1 1 0 1 | 0 1 1 0 1 |
| 1 1 1 0 | 0 1 1 1 0 |
| 1 1 1 1 | 0 1 1 1 1 |

SHAPING CODES FOR MEMORY

PRIORITY INFORMATION

This application is a Continuation of U.S. application Ser. No. 13/683,440, filed Nov. 21, 2012, which issues as U.S. Pat. No. 8,984,369 on Mar. 17, 2015, the contents of which are incorporated herein by reference.

TECHNICAL FIELD

The present disclosure relates generally to semiconductor memory apparatuses and methods, and more particularly, to shaping codes for memory.

BACKGROUND

Memory devices are typically provided as internal, semiconductor, integrated circuits in computers or other electronic devices. There are many different types of memory including volatile and non-volatile memory. Volatile memory can require power to maintain its data (e.g., user data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is utilized as volatile and non-volatile data storage for a wide range of electronic applications. Non-volatile memory (e.g., NAND flash memory, NOR flash memory, etc.) may be used in portable electronic devices, such as laptop computers, solid state drives (SSDs), portable memory sticks, digital cameras, cellular telephones, portable music players such as MP3 players, movie players, and other electronic devices. Memory cells can be arranged into arrays, with the arrays being used in memory devices.

Some memory cells exhibit wear based on the quantity of program and/or erase cycles to which they are subjected. That is, memory cell performance can degrade with repeated use. Degradation may lead to problems such as decreased data retention, for instance.

DETAILED DESCRIPTION

One example apparatus comprises an array of memory cells and a shaping component coupled to the array and configured to encode each of a number of received digit patterns according to a mapping of received digit patterns to shaping digit patterns. The mapping of received digit patterns to shaping digit patterns obeys a shaping constraint that limits, to an uppermost amount, an amount of consecutive digit of the shaping digit patterns allowed to have a particular digit value.

A number of embodiments of the present disclosure can include encoding processes that can skew programmed data states toward those data states corresponding to lower threshold voltage levels, which can provide improved data retention as compared to prior approaches, among other benefits. Improved data retention can, for instance, increase the useful lifetime of memory devices, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "M" and "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
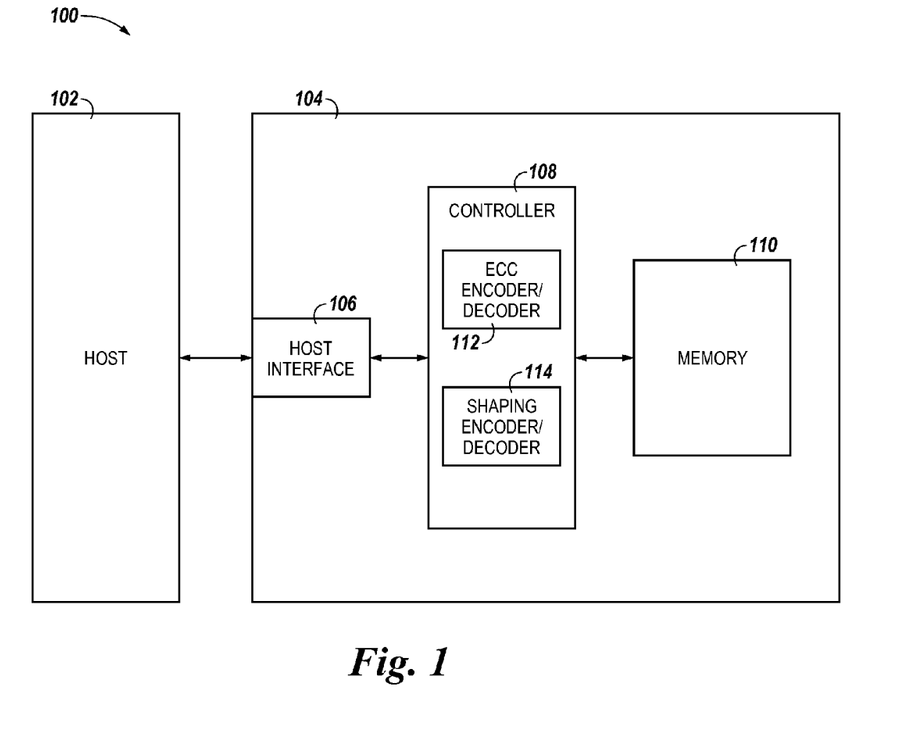
FIG. 1 is a block diagram of an apparatus in the form of a computing system including at least one memory system configured to implement shaping codes for memory in accordance with a number of embodiments of the present disclosure.

FIG. 1 is a block diagram of an apparatus in the form of a computing system 100 including at least one memory system 104 configured to implement shaping codes for memory in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110, which can be referred to as memory 110. The memory 110 can comprise, for instance, a number of solid state memory devices such as NAND flash devices, which provide a storage volume for the memory system 104.

The controller 108 can be coupled to the host interface 106 and to the memory 110 via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., a memory device having an on-die controller).

The controller 108 can communicate with the memory 110 (which in some embodiments can be a number of memory arrays on a single die) to control data read, write, and erase operations, among other operations. As an example, the controller 108 can be on a same die or a different die than a die or dice corresponding to memory 110.

Although not specifically illustrated, the controller 108 can include a discrete memory channel controller for each channel coupling the controller 108 to the memory 110. The controller 108 can include, for example, a number of components in the form of hardware and/or firmware (e.g., one or more integrated circuits) and/or software for controlling access to the memory 110 and/or for facilitating data transfer between the host 102 and memory 110.

As illustrated in FIG. 1, the controller 108 can include an error correction component 112 (ECC ENCODER/DECODER) and a shaping component 114 (SHAPING ENCODER/DECODER). The error correction component 112 can include, for example, an algebraic error correction circuit such as one of the group including a Bose-Chaudhuri-Hocquenghem (BCH) error correction circuit and a Reed Solomon error correction circuit, among other types of error correction circuits. The shaping component 114 can include, for example, circuitry configured to encode received digit patterns (e.g., data received from host 102 and to be written to memory 110) in accordance with a mapping of received digit patterns to shaping digit patterns, as described further herein. The shaping component 114 (e.g., a shaping encoder and/or decoder) can also include circuitry configured to decode received digit patterns (e.g., data read from memory 110 that has been encoded in accordance with the aforementioned mapping). An example mapping is described further in connection with FIG. 4. Although the term "bit" (e.g., binary digit) is used in examples described herein, embodiments are not limited to a binary digit system.

Figure 6A:
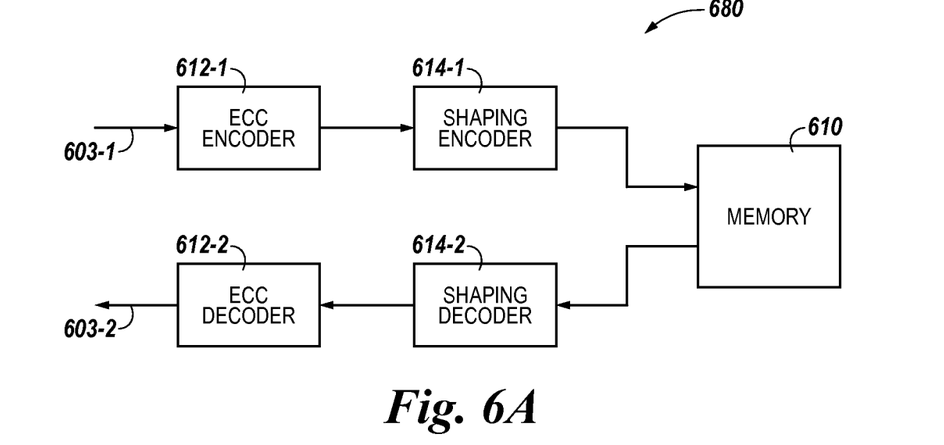
FIG. 6A is a block diagram of a portion of an apparatus associated with shaping codes for memory in accordance with a number of embodiments of the present disclosure.
Figure 6B:
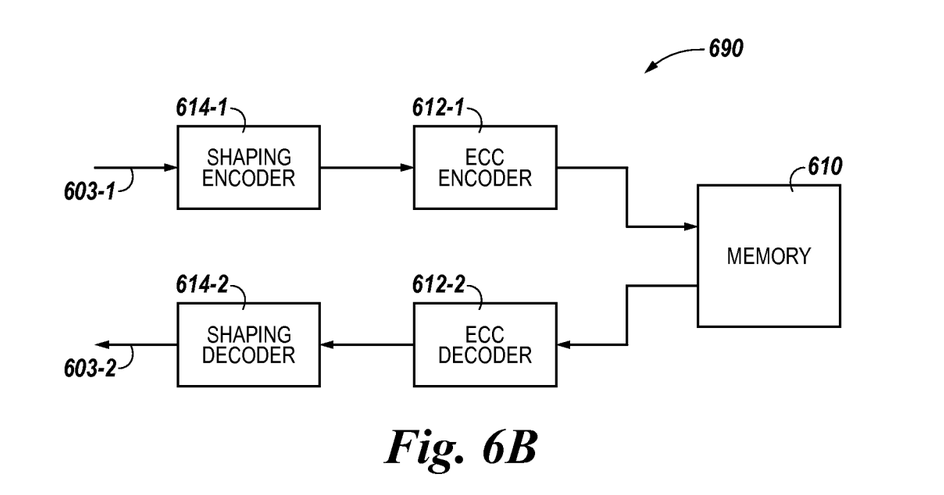
FIG. 6B is a block diagram of a portion of an apparatus associated with shaping codes for memory in accordance with a number of embodiments of the present disclosure.

Each of the error correction component 112 and shaping component 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the error correction component 112 and shaping component 114 can be external to the controller 108 or have a number of components located within the controller 108 and a number of components located external to the controller 108. As illustrated in FIGS. 6A and 6B, the error correction component 112 and shaping component 114 can comprise separate encoding and decoding components, in a number of embodiments.

The memory 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory 110 as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

According to a number of embodiments, controller 108 can be configured to control encoding each of a number of received bit patterns according to a mapping of received bit patterns to shaping bit patterns, wherein the mapping of received bit patterns to shaping bit patterns obeys a shaping constraint that includes an uppermost amount of consecutive bits of the shaping bit patterns having a first bit value. The controller 108 can also control programming the encoded number of received bit patterns to a group of memory cells (e.g., a page of memory cells associated with memory 110). As described further herein, the shaping constraint associated with the encoded bit patterns can result in skewing a proportion of programmed data states corresponding to lower threshold voltage (Vt) levels as compared to uniformly random bit patterns, for instance.

Figure 2:
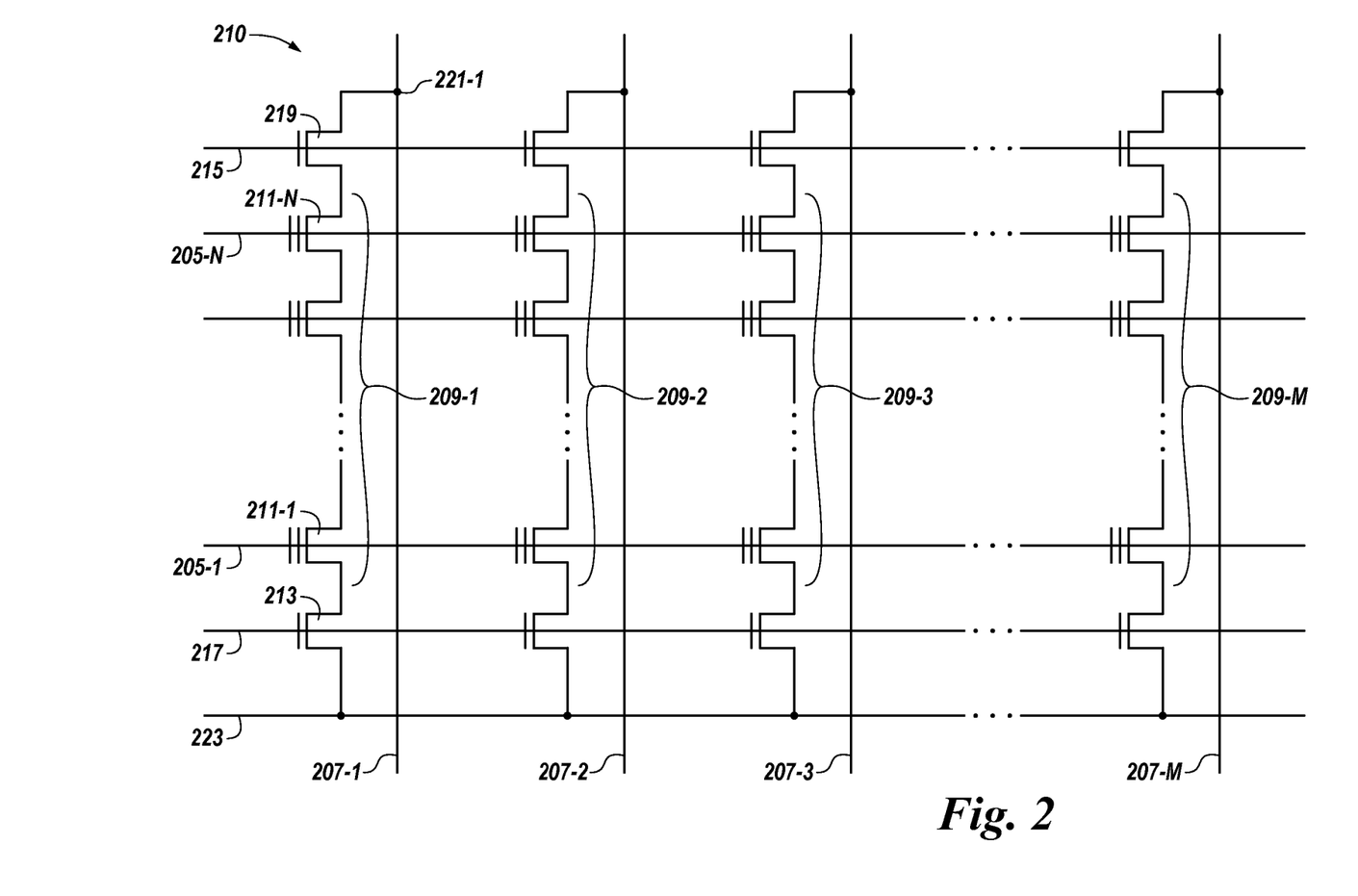
FIG. 2 is a schematic of a portion of a memory comprising an array of memory cells operable in accordance with a number of embodiments of the present disclosure.

FIG. 2 is a schematic of a portion of a memory 210 comprising an array of memory cells operable in accordance with a number of embodiments of the present disclosure. The embodiment of FIG. 2 illustrates a NAND architecture non-volatile memory array. However, embodiments described herein are not limited to this example. As shown in FIG. 2, the memory array includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

The memory array includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, ..., 211-N includes a source, a drain, a floating gate or other charge storage structure, and a control gate. The memory cells 211-1, ..., 211-N have their control gates coupled to a word line, 205-1, ..., 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

In operation, a number of cells coupled to a selected word line (e.g., 205-1, ..., 205-N) can be written and/or read together as a group. A group of cells written and/or read together can be referred to as a page of cells and can store a number of pages of data. For instance, as described further below in association with FIG. 3, the memory cells 211-1, ..., 211-N can be multilevel cells configured to store more than one digit (e.g., bit) of data. In some such instances, the bits stored in each multilevel cell can correspond to different pages of data. For example, a first bit of a 2-bit cell may correspond to a first page of data (e.g., a lower page), and a second bit of the 2-bit cell may correspond to a second page of data (e.g., an upper page). Cells storing more than two bits per cell may comprise a first bit corresponding to a lower page of data, a second bit corresponding to an upper page of data, and one or more additional bits corresponding to one or more middle pages of data. A number of cells coupled to a particular word line and programmed together to respective data states can be referred to as a target page. A programming operation can include applying a number of program pulses (e.g., 16V-20V) to a selected word line in order to increase the threshold voltage (Vt) of selected cells coupled to that selected word line to a desired voltage level corresponding to a targeted data state.

Read operations can include sensing a voltage and/or current change of a bit line coupled to a selected cell in order to determine the state of the selected cell. The read operation can include precharging a bit line and sensing the discharge when a selected cell begins to conduct. One type of read operation comprises applying a ramping read signal to a selected word line, and another type of read operation comprises applying a plurality of discrete read signals to the selected word line to determine the states of the cells.

Figure 3:
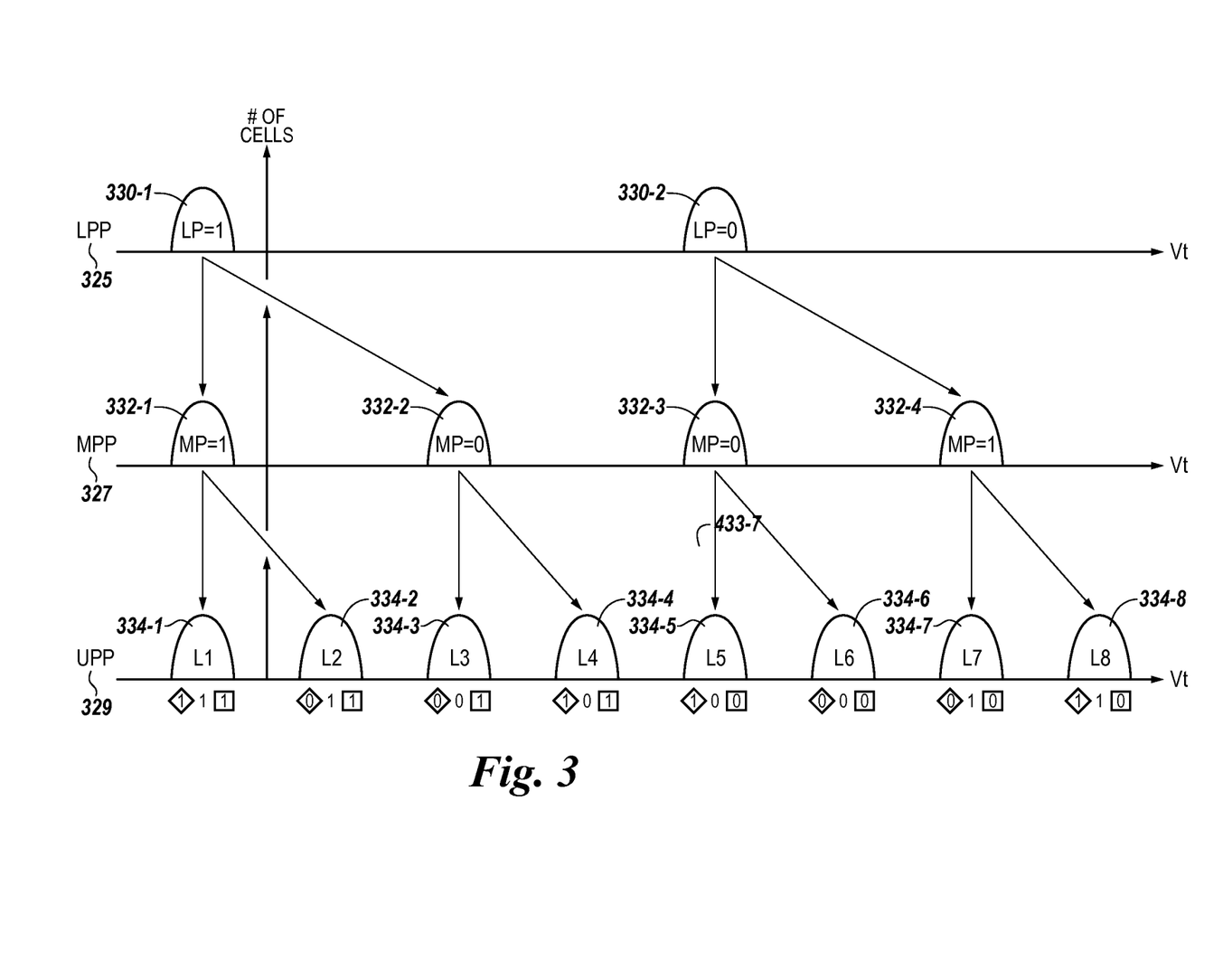
FIG. 3 illustrates a diagram associated with programming memory cells in accordance with a number of embodiments of the present disclosure.

FIG. 3 illustrates a diagram associated with programming memory cells in accordance with a number of embodiments of the present disclosure. In this example, the memory cells are 3-bit memory cells with each cell being programmable to one of eight data states (e.g., L1 to L8) each indicating a different 3-bit stored bit pattern (e.g., 111, 011, 001, 101, 100, 000, 010,, and 110). In a number of embodiments, each of the bits in the 3-bit stored bit pattern corresponds to a different page of data. For instance, the least significant bit (LSB) (right most bit shown as boxed in FIG. 3) can contribute to a first page of data (e.g., a lower page of data), the middle bit can contribute to a second page of data (e.g., a middle page of data), and the most significant bit (MSB) (left most bit shown as surrounded by diamond symbol in FIG. 3) can contribute to a third page of data (e.g., an upper page of data). As such, a page of cells can store three pages of data, in this example.

However, embodiments are not limited to multilevel memory cells storing three bits of data. For instance, a number of embodiments can include memory cells configured to store more or fewer than three bits of data and/or a fractional number of bits of data. Also, embodiments are not limited to the particular bit values assigned to the data states L1 to L8.

The diagram shown in FIG. 3 illustrates threshold voltage (Vt) distributions of a number of cells after a lower page programming (LPP) process 325, a middle page programming (MPP) process 327, and an upper page programming (UPP) process 329. As one of ordinary skill in the art will appreciate, NAND flash memory cells can be erased prior to having new data programmed thereto.

As part of the LPP process 325, the Vt of the memory cells are adjusted (e.g., via programming pulses applied to a selected word line) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325.

As part of the MPP process 327, the Vt of the memory cells are adjusted to one of four levels represented by Vt distributions 332-1, 332-2, 332-3, and 332-4. In this example, cells whose middle page is to store a bit value of "1" (e.g., MP=1) are programmed to one of distributions 332-2 and 332-3 during MPP process 327, and cells whose middle page is to store a bit value of "0" (e.g., MP=0) are programmed to one of distributions 332-1 and 332-4 during MPP process 327.

As part of the UPP process 329, the Vt of the memory cells are adjusted to one of eight levels represented by Vt distributions 334-1 to 334-8, which correspond to data states L1, to L8, respectively, with each one of data states L1, to L8, indicating a different 3-bit stored bit pattern. In this example, cells programmed to data state L1, store data "111," cells programmed to data state L2, store data "011," cells programmed to data state L3, store data "001," cells programmed to data state L4, store data "101," cells programmed to data state L5, store data "100," cells programmed to data state L6, store data "000," cells programmed to data state L7 store data "010," and cells programmed to data state L8, store data "110."

In operation, cells programmed to higher Vt levels may have an increased retention noise as compared to cells programmed to lower Vt levels. For instance, the Vt of cells programmed to data states L7, and L8, may be more prone to increased shifting over time as compared to the Vt of cells programmed to data states L1, and L2. As such, retention noise can be reduced by providing a coding scheme that skews the stored bit patterns toward those stored bit patterns corresponding to lower Vt levels. In the example illustrated in FIG. 3, memory cells storing bit patterns "100," "000," "010," and "110" (e.g., those cells programmed to data states L5, L6, L7, and L8, respectively) correspond to cells whose lower page stores bit value "0." Memory cells storing bit patterns "111," "011," "001," , and "101" (e.g., those cells programmed to data states L1, L2, L3, and L4, respectively) correspond to cells whose lower page stores bit value "1." Therefore, cells storing bit value "1" in their lower page (e.g., cells programmed to Vt distribution 330-1 during LPP process 325) have a lower Vt level than cells storing bit value "0" in their lower page (e.g., cells programmed to Vt distribution 330-2 during LPP process 325). If uniformly random data is received (e.g., from a host), it would be expected that the received data will comprise 50% "1"s and 50% "0"s. As such, according to the programming process shown in FIG. 3, 50% of the cells (e.g., cells storing bit value "1" in their lower page) would be programmed to one of data states L1 to L4, and 50% of the cells (e.g., cells storing bit value "0" in their lower page) would be programmed to one of data states L5 to L8. Moreover, if the received data is to be programmed to a group of cells as a lower page of data, 50% of the cells will be programmed to Vt distribution 330-1 and 50% of the cells will be programmed to Vt distribution 330-2.

Therefore, retention noise can be reduced by encoding received bit patterns in accordance with a mapping of received bit patterns to shaping bit patterns such that when the encoded bit patterns are programmed to a group (e.g., a page) of cells as at least a portion of a page of data (e.g., a lower page), the proportion of cells whose lower page is programmed to a first bit value (e.g., "1") as compared to the proportion of cells whose lower page is programmed to a second bit value (e.g., "0") is skewed (e.g., toward the bit value corresponding to those stored bit patterns corresponding to lower threshold voltage levels).

Figure 4:
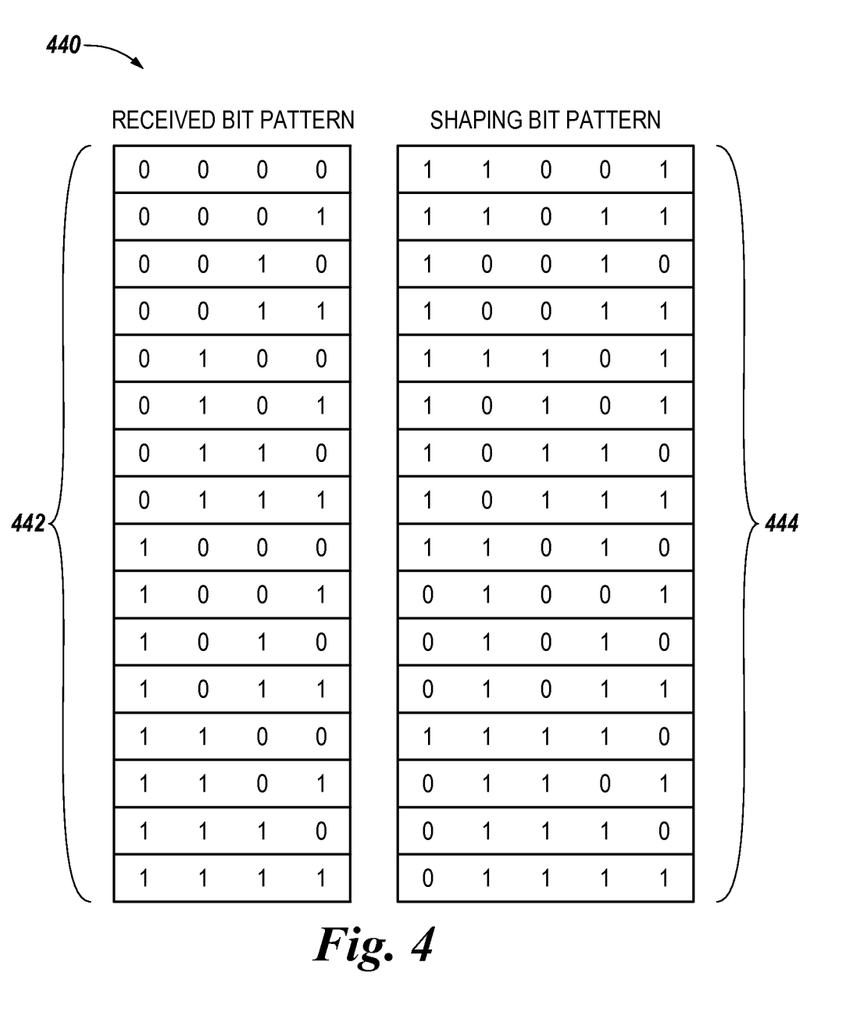
FIG. 4 illustrates a mapping between received digit patterns and shaping digit patterns in accordance with a number of embodiments of the present disclosure.

An example mapping of received digit (e.g., bit) patterns to shaping digit (e.g., bit) patterns is described further in association with FIG. 4. In a number of embodiments, the mapping obeys a shaping constraint that limits, to an uppermost amount, an amount of consecutive bits of the shaping bit patterns allowed to have a particular bit value. For instance, in order to skew programming of cells toward data states corresponding to lower Vt levels, the shaping constraint may limit the amount of consecutive "0s" in the shaping bit patterns. As an example, a shaping constraint can be represented by (x, k), where "x" is the particular bit value (e.g., "0" or "1") and "k" is the uppermost (e.g., maximum) amount of consecutive bits in the shaping bit patterns having bit value "x." For instance, a (0, 2) shaping constraint can indicate that the maximum amount of consecutive "0s" in a string of shaping bit patterns is two. Similarly, a shaping constraint of (1, 4) can indicate that the maximum amount of consecutive "1s" in a string of shaping bit patterns is four. Embodiments are not limited to a particular value of "k". For example, in a number of embodiments "k" has a value of four or less.

In a number of embodiments, only those received bit patterns to be written to a lower page of a group of memory cells are encoded in accordance with the mapping of received bit patterns to shaping bit patterns. For instance, a controller (e.g., controller 108 shown in FIG. 1) can be configured to determine whether received data is to be written to the group of memory cells as a lower page of data, a middle page of data, or an upper page of data. In a number of embodiments, the received data is encoded in accordance with the mapping only if it is determined that the data is to be written to the group of cells as a lower page of data. In such embodiments, received data to be written to the upper page and received data to be written to one or more middle pages of the group of memory cells may not be encoded in accordance with the mapping.

However, embodiments are not so limited. For example, in a number of embodiments, data to be written to the upper page of a group of memory cells and/or data to be written to one or more middle pages of a group of memory cells can be encoded with a mapping of received bit patterns to shaping bit patterns. The mapping of received bit patterns to shaping bit patterns can be different for those bit patterns to be written to a lower page than the mapping for those bit patterns to be written to a middle page and/or an upper page of the group of memory cells.

As an example, the mapping of received bit patterns to mapping bit patterns can comprise a fixed number of M-bit received bit patterns and a corresponding fixed number of N-bit shaping bit patterns. In a number of embodiments, N is greater than M. Also, in a number of embodiments, N can be equal to M+1. For instance, FIG. 4 illustrates a mapping 440 between sixteen 4-bit received bit patterns 442 and a corresponding sixteen 5-bit shaping bit patterns 444. The received bit patterns 442 can represent data incoming (e.g., to a controller such as controller 108 shown in FIG. 1) from a host (e.g., host 102 shown in FIG. 1), for instance. As shown in FIG. 4, each 4-bit received bit pattern 442 maps to a particular 5-bit shaping bit pattern 444. In this example, the mapping 440 obeys a (0, 2) shaping constraint. That is, none of the shaping bit patterns 444 comprises more than two consecutive data values of "0." The (0, 2) shaping constraint corresponding to mapping 440 also ensures that strings of the shaping bit patterns 444 do not include more than two consecutive data values of "0."

In operation, received data (e.g., a number of received 4-bit bit patterns 442) is encoded in accordance with mapping 440 and then the encoded data (e.g., a number of shaping 5-bit bit patterns 444) is programmed to memory (e.g., memory 110 shown in FIG. 1 and memory 210 shown in FIG. 2). As such, this mapping example illustrated in FIG. 4 achieves a code rate of 4/5 (80%). That is, there is a 1/5 (20%) overhead associated with mapping 440 since it takes 20% more bits to represent a particular amount of data. However, when the mapping 440 is applied to approximately uniformly random data, it yields about 62% "1s" and 38% "0s" in the encoded data (e.g., as compared to a 50/50, mix of "0s" and "1s" for unencoded uniformly random data). As such, when mapping 440 is employed in association with programming a lower page of data (e.g., LPP process 325 shown in FIG. 3), for example, about 62% of cells will store "1" in their lower page and about 38% will store "0" in their lower page. Therefore, even if the mapping 440 is not used in association with programming the upper pages or middle pages of the cells, the stored bit patterns of the cells (e.g., after upper page programming) will be skewed toward stored bit patterns whose LSB (e.g., lower page) has a bit value of "1" (e.g., toward data states corresponding to lower Vt levels).

Embodiments are not limited to the mapping 440 described in FIG. 4. For example, mappings other than mapping 440 can be used to achieve a (0, 2) shaping constraint, and embodiments are not limited to a particular shaping constraint. As indicated in Table 1 below, the code rates achievable via particular shaping constraints increase as the value of "k" increases. For instance, as shown in Table 1, increasing the limit on the uppermost amount of consecutive bits in the shaping bit patterns allowed to have a bit value of "0" increases the maximum code rate achievable via a particular "k" value.

TABLE 1

| (0, k) CONSTRAINT | MAXIMUM POSSIBLE CODE RATE |
|---|---|
| 1 | 0.694 |
| 2 | 0.879 |
| 3 | 0.947 |
| 4 | 0.975 |
| 5 | 0.988 |
| 6 | 0.994 |
| 7 | 0.997 |
| 8 | 0.999 |

As such, providing shaping constraints with higher "k" values increases the maximum possible code rates, which can decrease overhead associated with mappings; however, providing shaping constraints with higher "k" values also decreases the ability of an associated mapping to skew programmed data (e.g., toward lower Vt levels) since the proportion of "1s" and "0s" in the encoded bit patterns will be closer to 50/50. As one example, a mapping of 16-bit received bit patterns to 17-bit shaping bit patterns that obeys a (0, 4) constraint can achieve a code rate of about 94% (16/17) and can achieve a distribution of about 57% "1s" and 43% "0s" in the encoded data. As such, the 16:17, mapping achieves a higher code rate than the 4:5 mapping 440 shown in FIG. 4, but achieves a lesser amount of skew of "1s"/"0s" in the encoded data (e.g., 57/43 versus 62/38).

Figure 5A:
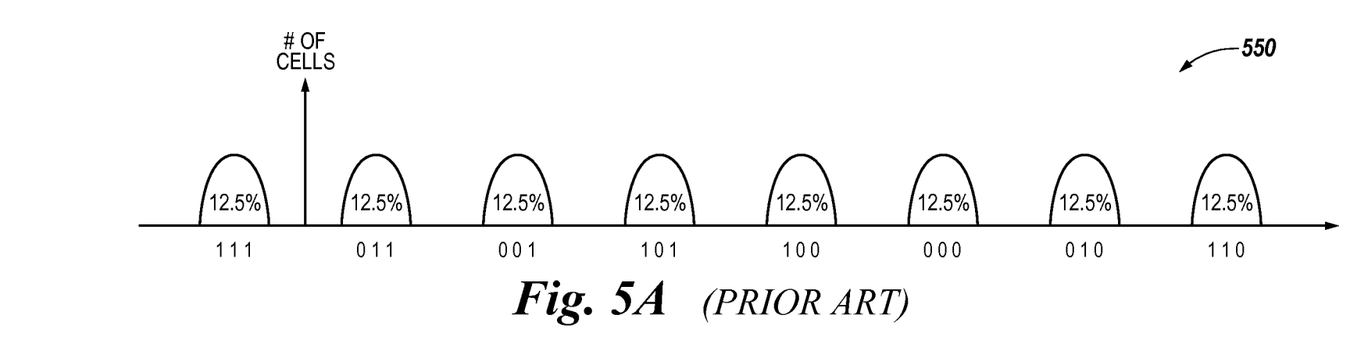
FIG. 5A is a diagram illustrating proportions of stored digit patterns associated with memory cells programmed in accordance with the prior art.

FIG. 5A is a diagram 550 illustrating proportions of stored bit patterns associated with memory cells programmed in accordance with the prior art. The example illustrated in FIG. 5A corresponds to memory cells programmed to one of eight data states, which each represent a different stored 3-bit bit pattern. The memory cells can be programmed via a lower page, middle page, and upper page programming process such as that described in association with FIG. 3. During lower page programming, the cells are programmed to one of two Vt levels (e.g., 50% to each Vt level assuming uniformly random data). During middle page programming, the cells are programmed to one of four Vt levels (e.g., 25% to each Vt level assuming uniformly random data). During upper page programming, the cells are programmed to one of eight Vt levels (e.g., 12.5% to each Vt level assuming uniformly random data). As such, the likelihood of a cell storing each of the eight different 3-bit bit patterns is 12.5%, as shown in FIG. 5A.

Figure 5B:
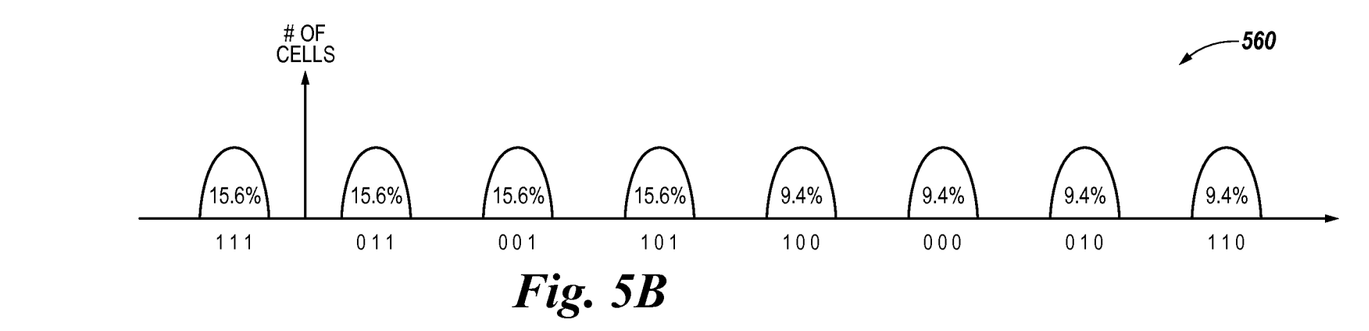
FIG. 5B is a diagram illustrating proportions of stored digit patterns associated with memory cells programmed in accordance with the mapping shown in FIG. 4.

FIG. 5B is a diagram 560 illustrating proportions of stored bit patterns associated with memory cells programmed in accordance with the mapping shown in FIG. 4. As such, the example illustrated in FIG. 5B corresponds to memory cells programmed to one of eight data states, which each represent a different stored 3-bit bit pattern. The memory cells can be programmed via a lower page, middle page, and upper page programming process such as that described in association with FIG. 3. However, in a number of embodiments, the received bit patterns to be written to at least one of the lower page, middle page, and upper page of the cells are encoded in accordance with embodiments described herein. For instance, in the example illustrated in FIG. 5B, received bit patterns (e.g., received bit patterns 442) are encoded in accordance with the mapping 440 shown in FIG. 4, which obeys a (0, 2) shaping constraint. As such, during a lower page programming process, the encoded bit patterns (e.g., shaping bit patterns 444) are written to the lower page of a group (e.g., a page) of memory cells. Due to the encoding associated with mapping 440, the proportion of cells having a lower page data value of "1" versus a data value of "0" is about 62.4%/37.6% (e.g., assuming uniformly random received data).

As described above, the mapping 440 can skew the stored bit patterns toward those stored bit patterns corresponding to lower Vt levels (e.g., toward bit patterns "111," "011," "001," and "101", in this example). Assuming received bit patterns to be written to a middle page and an upper page of the cells are not encoded in accordance with the mapping 440 (e.g., only data to be written to lower pages are encoded in accordance with the mapping 440), the proportions of stored bit patterns will be as illustrated in diagram 560. That is, about 15.6% of the group of cells will store bit pattern "111," about 15.6% of the group of cells will store bit pattern "011," about 15.6% of the group of cells will store bit pattern "001," about 15.6% of the group of cells will store bit pattern "101," about 9.4% of the group of cells will store bit pattern "100," about 9.4% of the group of cells will store bit pattern "000," about 9.4% of the group of cells will store bit pattern "010," and about 9.4% of the group of cells will store bit pattern "110." As such, as compared to the prior art example of FIG. 5A, cells programmed in accordance with a number of embodiments of the present disclosure, such as that shown in FIG. 5B, can have an increased proportion of cells programmed to data states corresponding to lower Vt levels. Therefore, embodiments of the present disclosure can reduce the likelihood of data retention noise as compared to previous approaches, among other benefits.

FIGS. 6A and 6B illustrate each illustrate a block diagram of a portion of an apparatus associated with shaping codes for memory in accordance with a number of embodiments of the present disclosure. The examples illustrated in FIGS. 6A and 6B include an error correction code (ECC) encoder 612-1, a shaping encoder 614-1, a memory 610, a shaping decoder 614-2, and an ECC decoder 612-2.

The ECC encoder 612-1 can comprise an algebraic error correction circuit such as one of the group including a Bose-Chaudhuri-Hocquenghem (BCH) error correction circuit and a Reed Solomon error correction circuit, among other types of error correction circuits. The ECC encoder 612-1 can, for instance, add parity bits to incoming bit patterns received thereto. The ECC decoder 612-2 can decode ECC encoded data received thereto.

The shaping encoder 614-1 can include, for example, circuitry configured to encode received bit patterns in accordance with a mapping of received bit patterns to shaping bit patterns, as described above. The shaping decoder 614-2 can also include circuitry configured to decode received bit patterns (e.g., data read from memory 610 that has been encoded in accordance with the aforementioned mapping).

In FIGS. 6A and 6B, arrow 603-1 represents incoming data from a host (e.g., host 102 described in FIG. 1) to be written to memory 610. In apparatus 680, the incoming data 603-1 is encoded via ECC encoder 612-1 prior to being encoded via shaping encoder 614-1 and then the encoded data is written to memory 610. As such, error correction data (e.g., parity bits), which are added to data 603-1 via ECC encoder 612-1 are also encoded in accordance with the mapping via shaping encoder 614-1 prior to being written to memory 610. When the data stored in memory is read from the memory 610 (e.g., in response to a read command), the shaping decoder 614-2 can decode the read data in accordance with the mapping, the ECC decoder 612-2 can decode the ECC encoded data, and the user data can be provided back to the host (e.g., as indicated by arrow 603-2.

In apparatus 690, the incoming data 603-1 is encoded via ECC encoder 612-1 after being encoded via shaping encoder 614-1 and then the encoded data is written to memory 610. As such, error correction data (e.g., parity bits), which are added via ECC encoder 612-1 are not encoded in accordance with the mapping via shaping encoder 614-1 prior to being written to memory 610. Not encoding the error correction data via shaping encoder 614-1 can reduce the number of overhead bits added to the received data 603-1 (since the error correction parity bits added to the received data 603-1 will not be subject to encoding via shaping encoder 614-1). In response to a read command, the data read from memory (e.g., a page of data) can be decoded via ECC decoder 612-2 prior to being decoded via the shaping decoder 614-2, and the user data can be provided back to the host.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an error correction encoder configured to add error correction data to a received digit pattern;
    a shaping encoder coupled to the error correction encoder and configured to encode the received digit pattern and to encode the added error correction data in accordance with a mapping of digit patterns to shaping digit patterns;
    wherein the mapping of digit patterns to shaping digit patterns obeys a shaping constraint that limits, to an uppermost quantity, a quantity of consecutive digits of the shaping digit patterns allowed to have a particular digit value;
    wherein each one of the digit patterns corresponding to the mapping comprises fewer digits than a particular shaping digit pattern to which the respective digit pattern is mapped; and
    wherein the shaping encoder is configured to encode the received digit pattern and encode the added error correction data in accordance with the mapping of digit patterns to shaping digit patterns only when the received digit pattern is to be programmed to a group of memory cells as a lower page of data.

2. The apparatus of claim 1, wherein the error correction encoder and the shaping encoder reside on a controller.

3. The apparatus of claim 2, wherein the shaping encoder is coupled to a memory, the memory comprising multilevel memory cells programmable to one of multiple data states, with each of the multiple data states corresponding to a particular stored digit pattern, and wherein the shaping constraint is configured to skew the stored digit patterns of the memory cells toward those stored digit patterns corresponding to lower threshold voltage levels.

4. The apparatus of claim 2, wherein the controller is configured to control programming the encoded received digit pattern and the encoded added error correction data to a memory.

5. The apparatus of claim 1, wherein the error correction encoder is an error correction code (ECC) encoder/decoder.

6. An apparatus, comprising:
    an array of memory cells; and
    a shaping encoder coupled to the array and configured to encode each of a number of received digit patterns according to a mapping of received digit patterns to shaping digit patterns;
    wherein the mapping of received digit patterns to shaping digit patterns obeys a shaping constraint that limits, to an uppermost quantity, a quantity of consecutive digits of the shaping digit patterns allowed to have a particular digit value;
    wherein each one of the digit patterns corresponding to the mapping comprises fewer digits than a particular shaping digit pattern to which the respective digit pattern is mapped; and
    wherein the shaping encoder is configured to encode only those digit patterns of the number of received digit patterns that are to be programmed to a lower page of data corresponding to a group of memory cells.

7. The apparatus of claim 6, wherein the mapping is such that a string of the number of received digit patterns encoded in accordance with the mapping and corresponding to a page of data does not violate the shaping constraint.

8. The apparatus of claim 6, wherein the apparatus further comprises a controller coupled to the array and configured to control programming each digit of the encoded number of received digit patterns to a separate memory cell of a group of memory cells.

9. The apparatus of claim 8, wherein each memory cell of the group is configured to store multiple digits of data, the multiple digits of data comprising at least a first digit corresponding to a lower page of data and a second digit corresponding to an upper page of data.

10. The apparatus of claim 6, wherein the mapping comprises a fixed number of received M-digit digit patterns and a corresponding fixed number of shaping N-digit digit patterns, wherein N is greater than M.

11. The apparatus of claim 6, wherein the shaping constraint limits, to the uppermost quantity, the quantity of consecutive digits of the shaping digit patterns allowed to have at least one of:
    a digit value of "0"; and
    a digit value of "1".

12. The apparatus of claim 6, wherein the uppermost quantity is not greater than four.

13. An apparatus, comprising:
    an array of memory cells; and
    a controller coupled to the array and configured to control:
        encoding each of a number of received digit patterns according to a mapping of received digit patterns to shaping digit patterns, wherein the mapping of received digit patterns to shaping digit patterns obeys a shaping constraint that limits, to an uppermost quantity, a quantity of consecutive digits of the shaping digit patterns having a first digit value; and programming the encoded number of received digit patterns to a group of memory cells as at least a portion of a page of data, and wherein the cells of the group of memory cells are configured to store data corresponding to a lower page of data and at least one additional page of data;

wherein each one of the digit patterns corresponding to the mapping comprises fewer digits than a particular shaping digit pattern to which the respective digit pattern is mapped; and wherein the number of received digit patterns are encoded only if the number of received digit patterns are to be programmed to a group of cells as at least a portion of a lower page of data via a lower page programming process.

14. The apparatus of claim 13, wherein the shaping digit patterns provided by the mapping achieves a desired proportion of "0" digit values to "1" digit values.

15. The apparatus of claim 13, wherein the number of received digit patterns are error encoded digit patterns.

16. The apparatus of claim 15, further comprising a shaping component configured to encode each of the number of error encoded received digit patterns.

17. The apparatus of claim 13, wherein the shaping constraint is configured to skew the shaping digit patterns toward digit patterns corresponding to lower threshold voltage levels.

* * * * *